United States Patent [19]

Mimura et al.

[11] Patent Number: 4,751,170
[45] Date of Patent: Jun. 14, 1988

[54] SILYLATION METHOD ONTO SURFACE OF POLYMER MEMBRANE AND PATTERN FORMATION PROCESS BY THE UTILIZATION OF SILYLATION METHOD

[75] Inventors: Yoshiaki Mimura, Atsugi; Isamu Kotaka, Sagamihara; Mineo Ueki, Atsugi, all of Japan

[73] Assignee: Nippon Telegraph and Telephone Corporation, Tokyo, Japan

[21] Appl. No.: 888,888

[22] Filed: Jul. 23, 1986

[30] Foreign Application Priority Data

Jul. 26, 1985 [JP] Japan .................................. 60-165041
May 21, 1986 [JP] Japan .................................. 61-116844

[51] Int. Cl.$^4$ .......................... G03C 5/16; G03C 1/72; B05D 3/06
[52] U.S. Cl. .................................. 430/296; 430/323; 430/312; 430/298; 430/313; 430/317; 430/327; 430/967; 430/328; 427/54.1; 156/628; 156/643; 204/157.15; 118/50.1; 118/723; 118/620; 118/641
[58] Field of Search .............. 430/323, 312, 298, 313, 430/317, 327, 296, 967, 328; 156/628, 643; 427/53.1, 54.1; 118/50.1, 723, 620, 641; 204/157.15

[56] References Cited

U.S. PATENT DOCUMENTS

| | | | |
|---|---|---|---|
| 4,232,110 | 11/1980 | Taylor | 430/313 |
| 4,426,247 | 1/1984 | Tamamura et al. | 430/313 X |
| 4,430,153 | 2/1984 | Gleason et al. | 430/323 X |
| 4,507,384 | 3/1985 | Morita et al. | 430/311 |
| 4,551,418 | 11/1985 | Hult et al. | 430/325 |
| 4,552,833 | 11/1985 | Ito et al. | 430/313 X |
| 4,613,398 | 9/1986 | Chiong et al. | 156/628 |

FOREIGN PATENT DOCUMENTS 0087569 12/1982 Japan .................................. 430/323

Primary Examiner—Paul R. Michl
Assistant Examiner—Cynthia Hamilton
Attorney, Agent, or Firm—Frishauf, Holtz, Goodman & Woodward

[57] ABSTRACT

A silylation method wherein a resist coating applied on a substrate is reacted with an organic silane compound under the irradiation of a deep ultraviolet ray to render regions of the resist coating durable to oxidative ion etching, whereby a fine pattern is formed. The resist coating includes a layer of an active polymer which is reactive with an organic silane compound under the irradiation of a deep ultraviolet ray to be combined with silyl groups, and a layer of an inert polymer which is not reactive with an organic silicone compound under the irradiation of a deep ultraviolet ray. A desired pattern is formed with the resist coating by ordinary lithographic technique, and then the active polymer layer of the pattern is allowed to contact with an organic silane compound while being irradiated with a deep ultraviolet ray to introduce silyl groups into the active polymer layer of the pattern so as to form masking regions durable to oxidative ion etching. The substrate is then subjected to oxidative ion etching to form a fine pattern thereon.

16 Claims, 4 Drawing Sheets

FIG. I
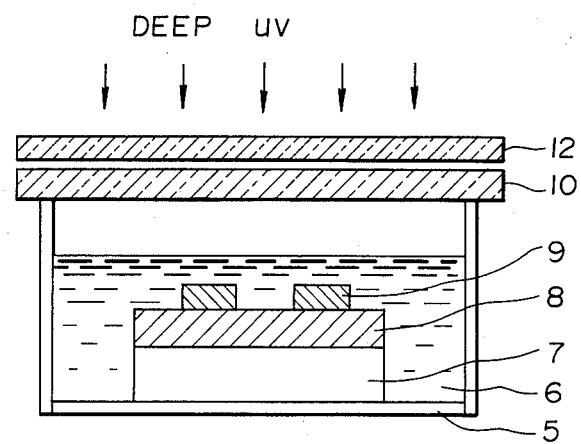
FIG. 2
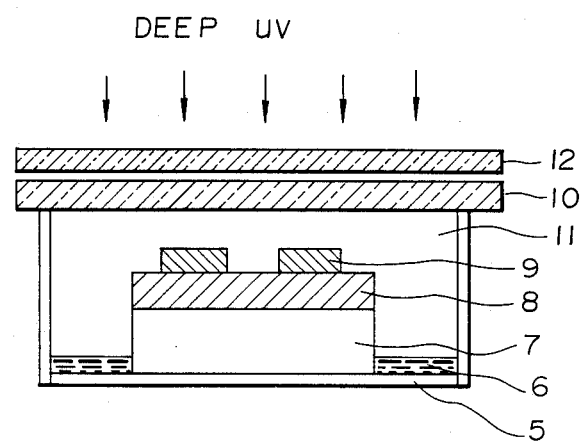

SILYLATION METHOD ONTO SURFACE OF POLYMER MEMBRANE AND PATTERN FORMATION PROCESS BY THE UTILIZATION OF SILYLATION METHOD

BACKGROUND OF THE INVENTION

1. Field of the Invention;

The present invention relates to a method of adding an organic silane compound on a surface of an organic polymer membrane by a photochemical reaction to silylate the surface of said polymer membrane, and to a method of forming a fine pattern accurately on a substrate for a variety of semiconductors or semiconductor devices.

2. Related Art Statement;

One of the conventional methods for adding an organic metal compound selectively on a surface of a polymer membrane is a selective chemical vapor deposition method (CVD method) of tetrachlorosilane gas. This known method is based on the principle that organic silane compounds have little tendency to be deposited on the surface of a perfluoro hydrocarbon polymer having a small surface energy to achieve the aimed selectivity. It is thus necessary to use a special polymer material in order to achieve satisfactory selectivity. However, it is difficult to achieve satisfactory selectivity with good reproducibility, since the selectivity is seriously affected by the deposition conditions the organic silane compound. The organic silane layer formed by this known method is deposited physically on the surface of the polymer rather than being coupled by chemical bonds.

The bi-layer resist systems and tri-layer resist systems have been developed to form an extremely fine pattern accurately.

Different from the resist coating applied by the conventional system wherein a single resist membrane is used to form a pattern, the resist coating formed through the bi-layer or tri-layer system has an advantageous effect that the local fluctuation is thickness, which often poses adverse affection on the formation of pattern, is eliminated. A further advantage of the bi-layer or tri-layer system resides in that the top resist layer forming the image can be thinner than that in the single layer system to form a fine pattern with accuracy. However, these known systems include complicated processing steps and require special resist materials.

In the tri-layer resist system, an organic polymer layer is coated on a substrate and baked, and then an inorganic polysilicon or $SiO_2$ or a silicon containing resin is applied on the baked organic polymer layer to form a middle layer on which a resist layer is coated to prepare the triple layer structure. A pattern is formed by the top resist layer through the conventional lithography, and the inorganic or silicon containing resin layer is etched in a Freon gas plasma while utilizing the pattern formed by the top resist layer as the masking. As a result of etching, the regions of the middle layer covered by the top resist pattern is left unetched. Then the organic polymer layer, i.e. the bottom layer, is subjected to dry etching in an oxygen gas plasma through the masking pattern formed by the unetched middle layer. The top resist pattern is removed during the dry etching step, since it is not durable to the oxygen gas plasma to leave the pattern covered by the middle layer. In this process, the middle layer made of an inorganic material or a silicon containing resin having the oxygen plasma durability must be applied to form a mask, since it is difficult to etch the bottom organic polymer layer directly while using the top polymer pattern as a mask durable to dry etching.

In contrast thereto, the bi-layer resist system is characterized by the use of a top resist layer which is durable to oxygen plasma. If such a resist material that is durable to oxygen plasma is developed, a pattern is formed by the top resist material directly on the bottom organic polymer layer, without the need of providing the middle inorganic layer, to be ready for processing through the dry etching.

In order to provide an organic resist material having the oxygen plasma durability, it has already been proposed to introduce Si-containing groups in the main or side chain of the polymer by copolymerization, graft polymerization or esterification, to prepare an Si-containing resist material. For example, U.S. Pat. No. 4,507,384 discloses a siloxane polymer-containing resist material for forming a pattern. The resist material proposed by this prior Patent is prepared by introducing chloromethyl groups into the phenyl groups of a polyphenylsiloxane, and then substituting the chloro groups of the chloromethyl groups by acryloyloxy-, methacryloyloxy- or cinnamoyloxy-groups. It is generally known that silicon contained in a polymer as a structural element affects significant influences on the basic properties thereof, when the polymer is used as a resist forming material, including the solubility in a solvent sensitivity and the resolution. Due to the adverse affections on the basic properties induced by the introduction of silicon, it has been difficult to provide a polymer with the oxygen plasma durability without deteriorating the basic properties thereof for forming satisfactory resist pattern. For this reason, all of the known resist materials for forming negative and positive images by the irradiation of ultraviolet rays and the known resist materials for forming negative images could not be deemed as having totally satisfactory performance characteristics. The quality of a pattern formed by the bi-layer resist system depends principally on the quality of the pattern forming top resist layer and the oxygen plasma durability thereof. The bi-layer resist system has not yet been used for practical applications, due to the fact that an Si-containing resist material excellent in total performance characteristics has not been developed.

U.S. Pat. No. 4,551,418 discloses a method of forming a resist pattern of a negative image by a cationic photo polymerization. The method disclosed by the prior Patent comprises the steps of coating a polymer layer containing a cationic photo polymerization initiator, treating the thus coated polymer layer with a cationically sensitive organic silicone monomer, irradiating the thus treated organic layer with a deep ultraviolet ray to form a pattern which is durable to plasma etching, and then subjecting the polymer layer to plasma etching to leave the pattern protected by the durable resist. The principle utilized in this method is that selected portions of p-tert-butoxycarbonyloxystyrene selected specifically as a polymer having a photosensitivity to a deep ultraviolet ray are exposed to a deep ultraviolet ray so that the portions exposed to the deep ultraviolet ray are selectively silylated by the subsequent step of allowing the polymer to contact with a hexamethylsilazane solution and the subsequent thermal treatment to form a pattern. Since the pattern is formed by silylating the exposed portions of the polymer, with the unexposed portions being not silylated, in this known method, satisfactory selectivity for forming a clear image can be scarcely attained for the principal defect involved therein. The method is detrimental in that the edge definition of the pattern is inferior, and that the etching rate ratio to the oxygen RIE cannot be set to a sufficiently high level, leading to the disadvantage that difficulties are encountered in forming a fine pattern with high accuracy. The resist material usable in this method is limited only to the aforementioned polymer, and the light which may be used in the lithographical pattern forming step is limited to deep ultraviolet rays. This prior Patent fails to teach the provision of laminated organic polymer membrane comprised of an active organic polymer which is reactive with an organic silane compound under the irradiation of a deep ultraviolet ray to be coupled with the silyl groups at the surface of the polymer, and an inert organic polymer which is not reactive with the organic silane compound; and also fails to teach a method of forming a pattern by ordinary lithographic technique using the organic polymer membrane, and a method of silylating selective portions of the surface of the active polymer.

OBJECTS AND SUMMARY OF THE INVENTION

An object of this invention is to provide a novel method wherein an organic silane compound is added to a selected region of a polymer membrane comprised of an active polymer layer and an inert polymer layer.

Another object of this invention is to provide a novel pattern forming method wherein a masking pattern durable to oxygen gas plasma is formed by the selective silylation of a selected region of a polymer membrane comprised of an active polymer layer and an inert polymer layer.

The pattern forming method, according to the invention, comprises the steps of forming a pattern by an ordinary resist material which does not contain Si to form an overcoat resist layer, and then adding Si at the selected region of the overcoat resist layer by the photochemical organic silane addition reaction or silylation reaction to form a pattern which is durable to oxygen plasma etching.

More specifically, the present invention provides a pattern forming method comprising the steps of forming a laminated organic polymer membrane including a layer of an active organic polymer which is reactive with an organic silane compound under the irradiation of a deep ultraviolet ray and a layer of an inert organic polymer which is not reactive with the organic silane compound even under the irradiation of a deep ultraviolet ray, the active organic layer forming a pattern, exposing said pattern forming active organic layer to a deep ultraviolet ray while allowing the laminated organic polymer membrane to contact with an organic silane compound thereby to introduce the silyl groups of the organic silane compound into the active organic polymer for rendering the pattern forming regions durable to an oxidative gas plasma, and subjecting the laminated organic polymer membrane to an oxidative plasma etching while utilizing the silylated pattern as the masking.

BRIEF DESCRIPTION OF THE DRAWINGS

FIG. 1 is a schematic illustration showing the step of silylating the resist layer by immersing in an organic silane compound of liquid form;

FIG. 2 is a schematic illustration showing the step of silylating the resist layer by contacting with vapor or an organic silane compound;

DESCRIPTION OF THE INVENTION

Figure 3:
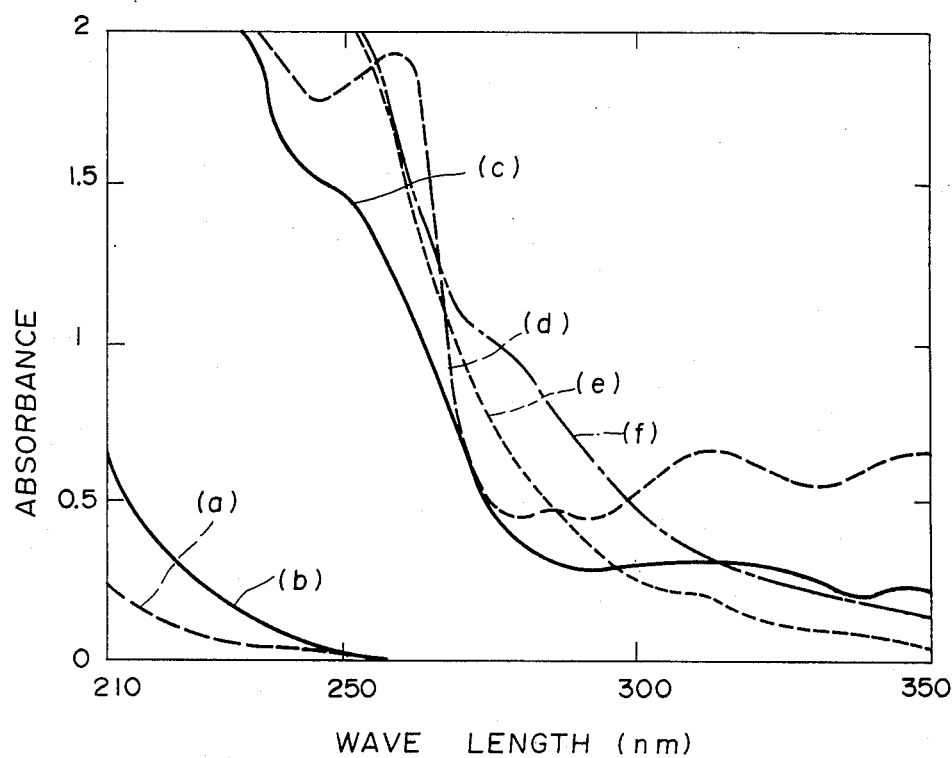
FIG. 3 is a graph showing ultraviolet ray absorption spectra of representative organic silane compounds.

The apparatuses shown schematically in FIGS. 1 and 2 are silylation apparatuses in which the resist layers are silylated according to the method of the invention. An organic silane monomer 6, such as trimethylchlorosilane, dimethyldichlorosilane, dimethylmonochlorosilane, trimethylsilyliodide or trimethylalkoxysilane, is contained in a container 5 either in the liquid form (FIG. 1) or in the vapor phase (FIG. 2).

Organic silane monomers which may be used in the present invention includes monohalogenated silane compounds, such as trimethylchlorosilane, triethylchlorosilane, triprophlchlorosilane, triphenylchlorosilane, dimethylchlorosilane, diphenylmethylchlorosilane, dimethyl-t-butylchlorosilane, tributylchlorosilane, t-butyldiphenylchlorosilane, octadecyldimethylchlorosilane, phenyldimethylchlorosilane, phenylmethylchlorosilane, tri-n-butylchlorosilane, trimethylchloromethylsilane, dimethylchloromethylchlorosilane, trimethyliodosilane, triphenyliodosilane, trimethyliodosilane, trimethylfluorosilane, triphenylfluorosilane, triethylfluorosilane, trimethylbromosilane, diphenylvinylchlorosilane, and triethylbromosilane.

Organic silane monomers which may be used in the present invention includes dihalogenated compounds, such as dimethyldichlorosilane, diethyldichlorosilane, diphenyldichlorosilane, methyldichlorosilane, octadecylmethyldichlorosilane, phenyldichlorosilane, dimethyldifluorosilane, diphenyldifluorosilane, diethyldifluorosilane, dimethyldiiodosilane, diphenyldiiodosilane, diethyldiiodosilane, dimethyldibromosilane, diphenyldibromosilane and diethyldibromosilane.

Organic silane monomers which may be used in the present invention includes trihalogenated compounds, such as methyltrichlorosilane, undecyltrichlorosilane, ethyltrichlorosilane, hexachlorodisilane, isobutyltrichlorosilane, phenyltrichlorosilane, metacryloyloxypropyl-trichlorosilane, octadecyltrichlorosilane, tolyltrichlorosilane, methyltrifluorosilane, trichlorosilane, n-trifluoropropyltrichlorosilane, vinyltrichlorosilane, methyltriiodosilane and methyltribromosilane.

Organic silane monomers which may be used in the present invention includes alkoxy compounds, such as dimethyldimethoxysilane, trimethylethoxysilane, dimethyldiethoxysilane, diphenyldimethoxysilane, triethylmethoxysilane, diethyldimethoxysilane, triethylethoxysilane and diethyldiethoxysilane.

The active organic polymers which may be used in the invention includes novolak type photo resists containing diazo compounds, vinyl phenol system resists, cresol novolak resins, phenol novolak resins, polymethyleneisopropylketone, polyacrylates, polyvinyl alcohol, methylmethacrylate polymers, polybutenesulfone and polystyrene derivatives.

The inert polymers which may be used in the invention include polyimide resin, polyethylene terephtalate, polytetrafluoroethylene, polyethylene, polypropylene and polyvinylchloride.

An undercoat polymer layer 8 was coated on a substrate 7, and a pattern 9 is formed by printing an overcoat resist through the conventional lithographic technique. The each substrate coated with the undercoat polymer layer 8 and formed with the pattern 9 (hereinafter referred to simply as "test piece") was immersed or soaked in the organic silane monomer (FIG. 1) or exposed to the vapor 11 of the organic silane monomer (FIG. 2), with the container being closed by a quartz plate 10. A sharp cut filter 12 for shielding ultraviolet rays may be placed on the quartz plate 10, as desired. Then, using a deep ultraviolet ray source, such as a Xe-Hg lamp or mercury long arc lamp, the surface of the test piece was irradiated by deep ultraviolet rays for a predetermined exposure time, and then the test piece was removed from the container 5 and dried. The test piece was placed in a parallel plate type reactive etching apparatus in which oxygen gas was introduced, so that the test piece was subjected to reactive ion etching. The etched quantities of the overcoat pattern layer 9 and the undercoat layer 8 were determined to calculate the etching rates of respective layers, which were compared with the etching rates of unsilylated layers to learn the occurrence of the silylation reaction and to determine the etching rate ratio. In order to learn the mechanism of addition reaction of the organic silane compound, infrared absorption spectra of the samples silylated with representative organic silane compounds were investigated. In addition, a sample was analyzed by the Auger electron spectroscopy to learn the depth of the reacted layer and the content of Si in the silylated layer. It has been found through these experiments that the addition reaction of an organic silane compound to the resist layer depends on the used light source and the used material for forming the layer.

The results of experiments have revealed the following facts. All of the tested materials have not been silylated by the use of an ultraviolet ray having a wavelength of more than 350 nm. However, when an ultraviolet ray having a short wavelength of less than 300 nm, some polymer materials are silylated while the other polymer materials are not silylated. In detail, ultraviolet ray resist such as AZ-1350J (diazo/novolak system resist), vinyl phenol system resists, cresol novolak resins and polymethylisopropylketone are silylated efficiently by an ultraviolet ray having a wavelength of from 250 to 300 nm, whereas methacrylic polymers and polyimides are not silylated by an ultraviolet ray having a wavelength within this range. On the other hand, methacrylic polymers, such as polymethacrylate (hereinafter referred to as "PMMA") and fluorobutylmethacrylate (hereinafter referred to as "FBM"), which absorb ultraviolet rays having wavelengths of less than 250 nm may be silylated by exposing to an ultraviolet ray having a wavelength of from 250 nm to 190 nm. The polystyrene base polymers may be silylated by exposing to an ultraviolet ray having a wavelength of from 280 nm to 180 nm. The polybutenesulfone hereinafter referred to as "PBS") may be silylated only by exposing to an ultraviolet ray having a wavelength of from 190 nm to 180 nm. In contrast thereto, polyimide resins, polyethylene terephthalate, polytetrafluoethylene, polyethylene, polypropylene and polyvinylchloride which are stable and not photosensitive are not silylated even if they are exposed to ultraviolet ray having any wavelength.

FIG. 3 shows ultraviolet ray absorption spectra of representative organic silane compounds. As shown, since dimethyldichlorosilane (a) and trimethylchlorosilane (b) have absorption bands only within the wavelength range of not more than 250 nm, they can be silylated by exposing to an ultraviolet rays having wavelengths of not more than 250 nm. On the other hand, dimethylchlorosilane (c), dimethylchloromethylchlorosilane (d) trimethyl allylsilane (e), and trimethylchloromethylsilane (f) are excited by an ultraviolet ray having a wavelength of from 250 to 350 nm, so that they are silylated by exposing them to such an ultraviolet ray.

Figure 4:
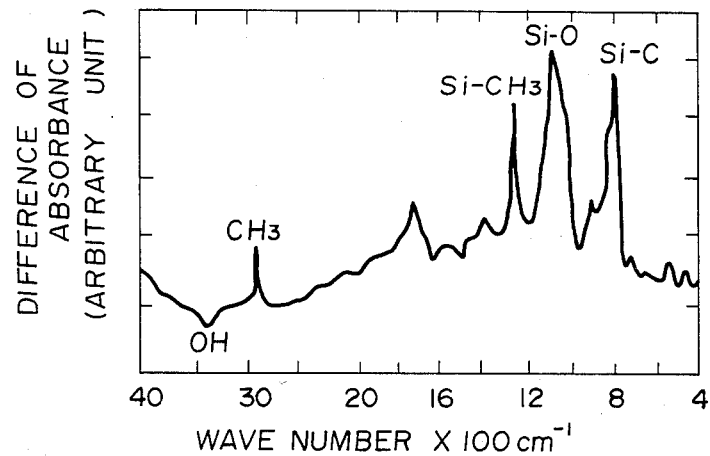
FIG. 4 is a spectrum chart of an FTIR (Fourier transformation infrared spectral) analysis of a cresol novolak resin layer coupled with silyl groups by deep ultraviolet ray irradiation.

FIG. 4 shows a typical example of an FTIR absorption spectrum (Fourier transformation infrared spectral analysis) of a cresol novolak resin layer photochemically silylated according to the method of the invention. This chart shows the difference between the IR absorption spectrum of the layer which has been exposed to a deep ultraviolet ray in the absence of an organic silane compound and the IR absorption spectrum of the layer which has been silylated to the deep ultraviolet ray in the presence of dimethylchlorosilane, wherein the downward peaks show the decreases in IR absorption by the silylation and the upward peaks show the increases in IR absorption by the silylation. The result shows the decrease of absorption by the OH group at about 3400 cm$^{-1}$, and the increases of absorptions respectively by Si-CH$_3$ (at about 1250 cm$^{-1}$), C=O (at about 1700 cm$^{-1}$), Si-O-C (at about 1100 cm$^{-1}$) and Si-C (at about 800 cm$^{-1}$). These changes in absorption spectrum reveal that chloroalkylsilane has been coupled with OH groups of the cresol novolak resin through siloxane bonds by the result of dehydrochloric acid reaction.

Halogenated organic silane compounds are excited and activated by absorbing a deep ultraviolet ray as follows:

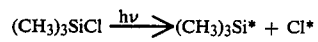

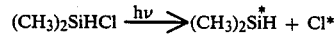

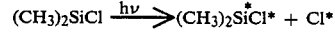

or

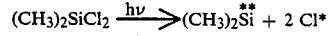

-continued

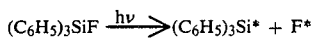

On the other hand, the cresol novolak resin is likewise excited and activated by absorbing the deep ultraviolet ray to react with the activated halogenated organic silane compounds as represented by the following reaction equations of:

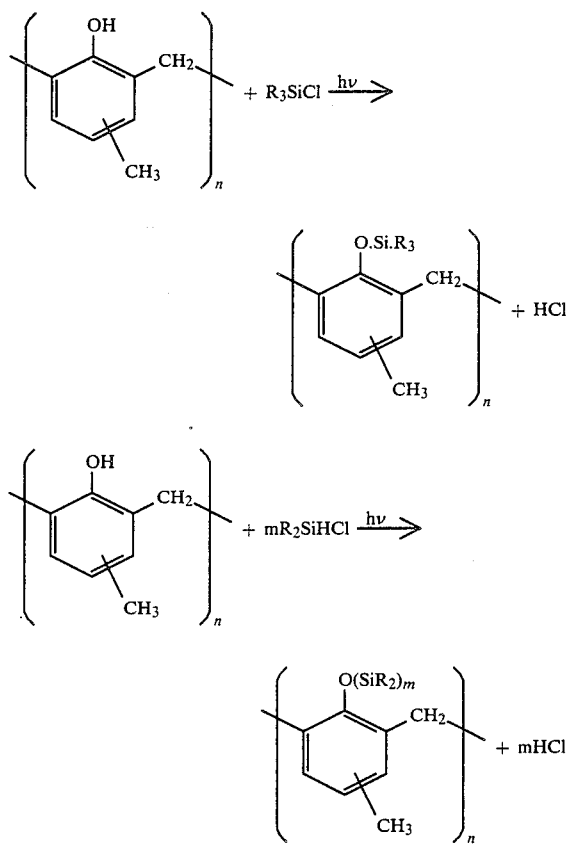

In case of silylation of a methacrylic polymer, it is estimated that the silylation reaction takes place at a cleaved or opened portion of the main chain of the methacrylic polymer.

As will be understood from the foregoing description, the silylation reaction induced by irradiation of light takes place on a phenol group particularly preferentially and effectively. Accordingly, the silylation method, according to the invention, may be effected with good yield by the use of phenol resins and vinyl phenol resins, in addition to the cresol novolak resins, and by the use of a variety of resist materials containing these resins as the base resinous materials.

In combined consideration of the results shown in FIGS. 3 and 4, it should been seen that an alkyl silane addition reaction of an organic silane compound to a polymer molecule forming the polymer layer is excited simultaneously with excitation of the organic silane compound. It is, thus, possible to induce a selective addition reaction of an organic silane by selecting suitable polymer material having proper wavelength band within which it can be excited for initiating silylation reaction.

Figure 5:
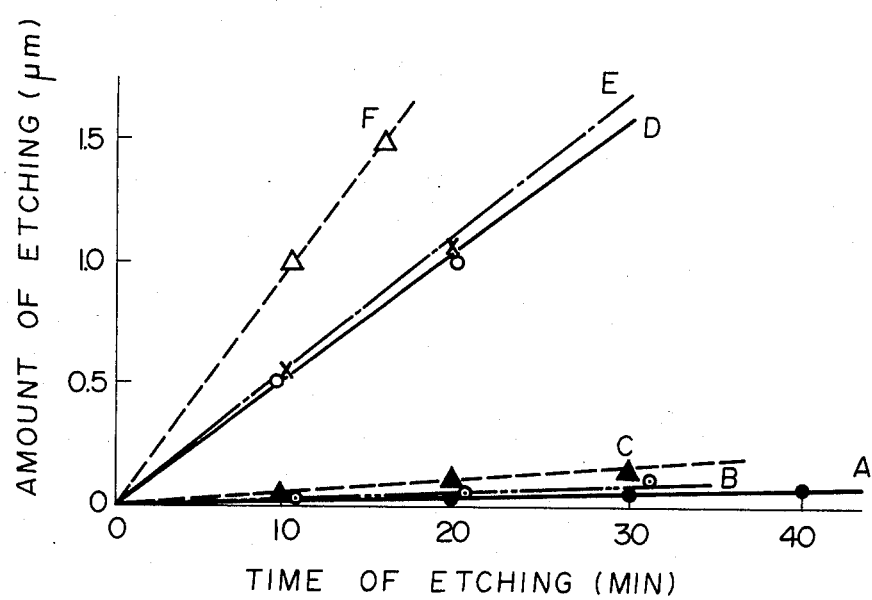
FIG. 5 is a graph showing the etching rates of silylated and unsilylated organic polymers processed in a parallel flat plate type reactive ion etching apparatus.

A silylated resist layer and the corresponding resist layer which had not been silylated were subjected to reactive ion etching (hereinafter referred to as "RIE") in oxygen gas atmosphere, and the etched quantities of both layers were measured to learn the etching rates and the etching rate ratio of both layers and to appraise the thickness of the silylated layer. FIG. 5 shows the etching rates of the samples which were etched in an oxygen gas atmosphere maintained at a pressure of 3.5 Pa while supplying a constant high frequency wave input of 65 mW/cm$^2$ in a parallel flat plate type reactive ion etching apparatus. The real line A in FIG. 5 shows the etching rate of an AZ-1350J resist layer (composed of a mixture of a cresol novolak resin and a photosensitive agent of o-naphthoquinonediazide) which has been silylated by irradiating the light rays from a 500 watt Xe-Hg lamp or a low pressure mercury arc lamp for 10 minutes in a vapo of dimethylchlorosilane. The dash line C shows the etching rates of a methacrylic polymer (polymethylmethacrylate; fluorobutylmethacrylate) layer and a polybutenesulfone layer. The real line D shows the etching rates of the Az-1350J resist layer and the cresol novolak resin which have not been silylated. The dog-and-dash line E shows the etching rate of a polyimide layer which has not been silylated. The dash line F shows the etching rates of the methacrylic polymer and the polybutenesulfone which have not been silylated. A 500 watt Xe-Hg short arc lamp and a high output low pressure mercury arc lamp were used as the deep ultraviolet ray sources. The deep ultraviolet rays having the wavelengths of not more than 350 nm and emitted from the former lamp has a surface illuminance of about 20 mW/cm$^2$, and the rays emitted from the latter lamp consist of a bright line spectrum at a wavelength of 184.9 nm (about 5 mW/cm$^2$) and a bright line spectrum at a wavelength of 254 nm (about 30 mW/cm$^2$).

It has been found from the aforementioned results that the reactive ion etching rate in an oxygen gas is considerably reduced by the silylation. For example, the etching rate of the unsilylated AZ-1350J is 0.5 micron/min, and that of the silylated layer is reduced to 0.012 micron/min, the etching rate of the latter being about 1/40 of that of the former. Likewise, the etching rate of unsilylated methacrylic polymers, such as PMMA, is 1 micron/min, and that of the silylated layer is reduced to 0.05 micron/min, the etching rate of the latter being about 1/20 of that of the former. It is thus revealed that the oxygen plasma durabilities of resist layers are remarkedly improved by the silylation of the invention. Although the date shown in FIG. 5 were obtained while using a parallel flat plate type reactive etching apparatus, the selectivity ratio may be further increased when etching is carried out in a cyclotron resonance type (ECR type) reactive ion etching apparatus.

Figure 6:
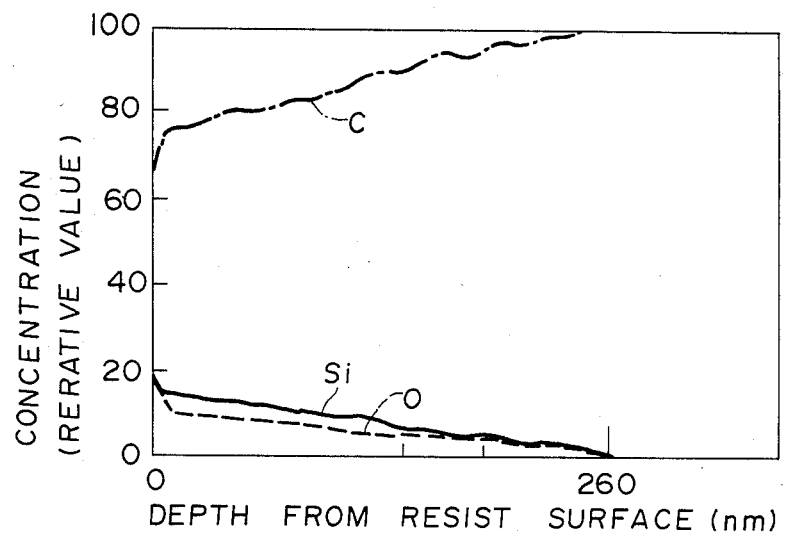
FIG. 6 is a graph showing the distributions of constituent atoms along the depth direction in the silylated layer analyzed by the AES(Auger electron spectroscopy)

In appraisal of the durability to dry etching of a silylated layer, another important factor other than the etching rate ratio is a thickness or depth of silylated layer. It is estimated from FIG. 5 that the thickness of silylated layer is not less than 0.2 micron. However, in order to have exact results, the distribution of constitutional atoms along the depth direction were determined by AES. FIG. 6, shows the result of a representative example which is obtained by using the same sample shown by the real line A in FIG. 5, wherein the abscissa indicates the depth from the surface and the ordinate indicates the relative concentrations of carbon (c), oxygen (O) and silicon (Si). The result was that the relative concentration of Si at the surface of the resist layer is about 15%, and the Si concentration is gradually decreased at the deeper locations. The presence of Si atom was confirmed at the distance from the surface of about 260 nanometer. It should be appreciated from the result that the silylated layer has a thickness of about 260 nanometer which may be deemed as sufficient for use as a durable mask for oxygen plasma dry etching in the bi-layer resist system which will be described hereinafter.

Although a Xe-Hg short arc lamp and a low pressure mercury arc lamp are used as the light sources in the experiments described above, similar advantageous effects may be obtained by the use of a high pressure mercury arc lamp, ultra high pressure mercury arc lamp, microwave excitation mercury lamp or deutrium lamp as a source for emitting intensive ultraviolet rays.

The oxygen plasma durability of a representative silylated resist has been described in detail with reference to FIG. 5, and it has been experimentally confirmed that satisfactory durabilities to oxygen plasma are provided by silylation of the aforementioned polymer materials by the silylation method of the present invention.

The experiments described hereinbefore reveal that the surface of a polymer membrane may be silylated selectively by the method of the invention, and that the thus silylated polymer membrane is remarkedly improved in durability to oxygen plasma. An improved technique of forming a bi-layer resist system which has extremely wide application ranges may be provided by utilizing the thin polymer layer excellent in oxygen plasma durability as the means for forming a pattern.

The following are specific examples of the method of forming a resist pattern in the bi-layer resist system of the invention.

EXAMPLE 1

Figure 7:
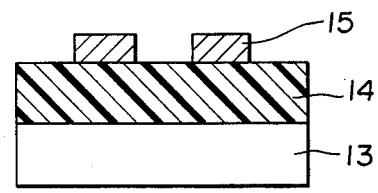
FIGS. 7 to 9 illustrate respective steps of one embodiment of the process for forming a pattern according to the invention.
Figure 8:
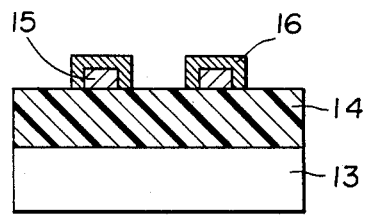
Figure 9:
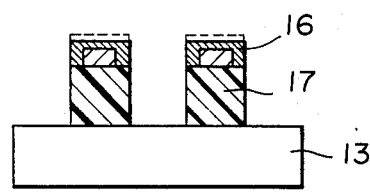

FIGS. 7 to 9 illustrate the steps of one embodiment of the process for forming a pattern according to the invention, wherein shown in section are substrate 13, an undercoat layer 14, an overcoat resist pattern 15, a silylated layer 16 formed by the addition of organic silane, and a final pattern 17 formed by the reactive ion etching.

In practice of the embodiment of the invention, a polyimide or PMMA layer having a thickness of about 1 to 2 microns was coated on the substrate 13 to form the undercoat polymer layer 14 which was baked at a temperature of about 200° C. for about an hour. A resist material (AZ-1350J) sensitive to ultraviolet rays was coated on the undercoat polymer layer 14 to form an overcoat resist layer having a thickness of about 0.3 to 0.5 micron which was baked at 95° C. for 5 minutes. Then, the desired pattern 15 is formed through the overcoat resist layer using a wafer stepper, as shown in FIG. 7. During the aforementioned steps, any undulations or steps along the surface of the substrate 13 are covered by the undercoat polymer layer 14 to make it possible to form the overcoat resist layer having an extremely uniform thickness, and a fine pattern including lines and spaces of about 0.6 micron may be formed with good reproducibility using a g-line wafer stepper having a lens of numerical aperture 0.35 since the undercoat layer 14 serves as a layer for absorbing the ultraviolet rays. Using a g-line wafer stepper having lens of numerical aperture 0.42 and an i-line wafer stepper having a lens of numerical aperture 0.35, a further fine pattern including lines and spaces of about 0.4 microns may be formed on the bi-layer system according to the invention. By adding an ultraviolet ray absorbing dye to the polyimide resin or the PMMA used for forming the undercoat layer, the light reflected by the substrate may be completely removed, whereby an extremely fine pattern may be formed.

The substrate coated with the undercoat layer 14 and formed with the pattern 15 was then immersed in liquid dimethylchlorosilane and irradiated by a deep ultraviolet ray source emitting ultraviolet rays having wavelengths of not more than 300 nm for about 10 minutes to effect coupling of the organic silane. In case where the undercoat layer is a PMMA coating, the light path is shielded by a sharp cut filter (UV-25) to cut the deep ultraviolet rays having wavelengths of shorter than 250 nm so that the surface of the PMMA coating is not silylated. As the result, the overcoat resist pattern 15 made of the resist material (AZ-1350J) sensitive to ultraviolet rays was added with the organic silane to form the silylated layer 16 having a depth of about 200 nm, as shown in FIG. 4.

The substrate 13 was transferred into a reactive ion etching apparatus where the undercoat layer 14 was etched for 10 to 30 minutes under the conditions set in consideration of the material and thickness thereof to form the final desired pattern 17, as shown in FIG. 9.

By forming a pattern through the method as described above, a suitable resist material may be selected from a variety of conventional resist materials in conformity with the requirement for a resist layer having high resolution, or a resist layer bearing either the negative or positive image, since any of the conventional resist materials may be used without restriction. Another advantage of the method, according to this embodiment, is that any lithographic systems may be used without particular limitation. Other than the exposure to the ultraviolet rays as described above, a fine pattern may be formed through a lithographic system wherein any of the deep ultraviolet rays, an electron beam, x-ray or an ion beam may be applied. The method of this embodiment has a remarkable merit that it can be applied for the production of various semiconductor elements, large scale integrated circuits and various electron devices containing sub-micron patterns.

Although the AZ-1350J resist has been used as the material for the overcoat resist layer, a number of other commercial positive photo resists each composed of a cresol novolak resin and an o-naphthoquinoneazide sensitizer may be used in place thereof to have similar advantageous merits, the examples being AZ-1350 and AZ-4000 and AZ-5260 produced and sold by Hoechst AG, MP-1300, MP-1400, MP-2400 and MP-111S produced and sold by Shipley Corp. and OFPR-800 and TSMR-8800 produced and sold by Tokyo Ohka K.K. Although the silylation has been effected by immersing the substrate in liquid dimethylchlorosilane in the illustrated example, silylation may be effected satisfactorily by exposing the substrate to a vapor of dimethylchlorosilane, trimethylchlorosilane, triethylchlorosilane, dimethyldichlorosilane, triphenylchlorosilane and trimethyliodosilane. Vapor of dimethylchlorosilane is preferred, since it has a low boiling point of 36° C. to be evaporated without using an evaporator. When silylation is effected in a vapor of any other organic silane compound, it is important to use an evaporator which can be heated to a temperature approximate to the boiling point of the selected organic silane compound to evaporate the same, in order that the silylation reaction taking place in the vapor is continued with good reproducibility.

EXAMPLE 2

In practice of the method of this example, a substrate 13 was coated with a polyimide to form an undercoat resist layer having thickness of about 1 to 2 microns. After baking at about 200° C. for about an hour, the undercoat resist layer was coated with a PMMA or FBM resist to form an overcoat resist layer having a thickness of about 0.3 to 0.5 micron, which was baked at 140° to 200° C.. A desired pattern was then formed on the overcoat resist layer by an electron beam lithography. An X-ray, ion beam or a deep ultraviolet ray may be used in place of the electron beam at this lithographic pattern forming step. Similarly as in Example 1, the substrate coated with the undercoat resist layer and formed with the desired pattern was immersed in liquid dimethylcholorosilane, and exposed to irradiation from a deep ultraviolet ray source emitting rays having wavelengths of not more than 300 nm for about 10 minutes to effect silylation. The undercoat resist (polyimide) layer was subjected to reactive ion etching while utilizing the thus silylated overcoat resist pattern as a mask to form a final desired pattern. In case where a methacrylic polymer forming a positive image by the irradiation of a deep ultraviolet ray is used as the material for the overcoat resist layer, the molecular weight of the polymer is reduced due to cleavage of the main chain by the irradiation of the deep ultraviolet ray in the liquid dimethylchlorosilane simultaneously with silylation. Particularly when the material for the overcoat resit layer is FBM which is readily soluble in an organic solvent, the part of the FBM reduced in molecular weight tends to dissolve in the liquid dimethylchlorosilane so that the overcoat layer becomes thinner. In order to prevent such undesirous side effect and to effect the aimed silylation predominantly, it is recommendable that an organic silane compound having a larger number of carbon atoms and smaller swelling and dissolving powers, such as triethylchlorosilane or triphenylchlorosilane, is used as the treating liquid, that trimethylchlorosilane or dimethylchlorosilane is diluted with Freon or a higher alcohol such as allylalcohol which is a poor solvent for FBM, or that dimethylchlorosilane is heated to 40° to 50° C. to evaporate the same to provide an atmosphere containing highly concentrated vapor of dimethylchlorosilane to which the substrate is exposed while being irradiated with the deep ultraviolet ray in lieu of immersing the substrate in liquid dimethylchlorosilane. Either one of the aforementioned alternative methods is effective not only when FBM is used as the material for the overcoat resist layer but also when a resist layer which is readily swelled or dissolved by the selected halogenated alkylsilane is to be silylated.

According to this example, an FBM resist pattern which is high in sensitivity but inferior in durability to a plasma, or a PMMA resist pattern having a capability of forming a pattern of high resolution but is inferior in durability to a plasma, may be transferred with high fidelity onto an organic polymer layer, such as a polyimide layer, which is relatively superior in durability to plasma etching. This is a great merit to afford a modified method of practical value. Similar results may be obtained by forming an electron beam resist by the overcoat resist layer made of another methacrylic polymer, such as PGMA or P(MMA-MA), or polymethylisopropylketone (hereinafter referred to as "PMIPK").

Substantially equivalent advantages as described in Example 1 are obtainable by this Example.

EXAMPLE 3

Generally following to the procedure as described in Example 2, the overcoat resist was formed by a vinyl phenol system resist (RE-5000P, RD-2000N, RU-1100N or RG-3000N produced and sold by Hitachi Kasei K.K.), and a desired pattern was formed on the thus formed overcoat resit layer by means of a light exposure (UV or deep UV) or an electron beam exposure. Then, the overcoat resist pattern was irradiated with deep ultraviolet rays while being exposed to a vapor of dimethylchlorosilane or dimethyldichlorosilane to silylate the overcoat resist pattern. Similarly as in Example 1 and 2, the undercoat resist pattern. Similarly as in Examples 1 and 2, the undercoat polyimide layer was subjected to reactive ion etching in an oxygen gas atmosphere while using the silylated overcoat resist pattern as a mask. The vinyl phenol system resists can be silylated similar to the cresol novolak system photo resists represented by the commercially available positive photo resists, the experimental data of which have been shown by FIGS. 4 to 6, to have sufficient durability enough for withstanding oxygen plasma etching.

EXAMPLE 4

Generally following to the procedure as described in Example 2, the overcoat resist was formed by cresol novolak resin, and a desired pattern was formed on the thus formed overcoat resist layer by means of a light exposure (UV or deep UV) or an electron beam exposure. Then, the overcoat resist pattern was exposed to deep ultraviolet rays having wavelengths of not more than 300 nm in a vapor of dimethylchlorosilane or trimethyldichlorosilane to silylate the overcoat resist pattern. Similarly as in Examples 1 to 3, the undercoat polyimide layer was subjected to reactive ion etching in an oxygen gas atmosphere while using the silylated overcoat resist pattern as a mask.

In place of the cresol novolak resin, a phenol novolak resin, a vinyl phenol resin and polymethylisopropylketone were used to form modified overcoat resit layers. The following procedure was the same as described hereinabove. Similar advantageous results were obtained.

EXAMPLE 5

Generally following to the procedure as described in Example 2, the overcoat resist was formed by a polybutenesulfone system resin, and a desired pattern was formed on the thus formed overcoat resist layer by means of a light exposure (UV or deep UV) or an electron beam exposure. Then, the overcoat resist pattern was irradiated with deep ultraviolet rays having wavelengths of not more than 190 nm while being exposed to vapor of dimethylchlorosilane or trimethyldichlorosilane to silylate the overcoat resist pattern. Similarly as in Examples 1 and 4, the undercoat polyimide layer was subjected to reactive ion etching in an oxygen gas atmosphere while using the silylated overcoat resist pattern as a mask.

EXAMPLE 6

Figure 10:
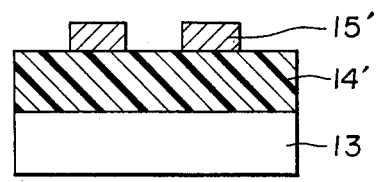
FIGS. 10 to 12 illustrate respective steps of another embodiment of the process for forming a pattern according to the invention.
Figure 11:
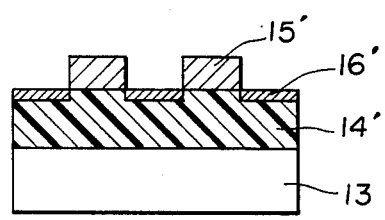
Figure 12:
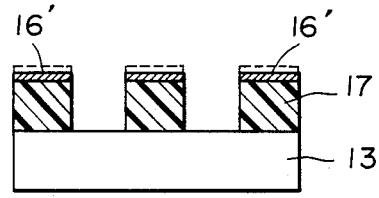

FIGS. 10 to 12 illustrate respective steps of a further embodiment of the process for forming a pattern according to the invention. In practice of the process or method of the invention, a resist sensitive to ultraviolet rays, such as a cresol novolak system resin or a bisphenol system resist, a cresol novolak resin or methacrylic polymer such as PMMA, was coated on a substrate 13' to form an undercoat resist layer having a thickness of about 1 to 2 microns, as shown in FIG. 10, and then the undercoat resist layer was baked at a temperature of from 200° to 250° C. The undercoat resist layer made of the resist sensitive to ultraviolet rays or made the cresol novolak resin was coated with either one of FBM, PMMA or PBS to form a coating having a thickness of about 0.3 to 0.5 microns, and a reverse pattern 15' was formed to cover the regions, which were finally removed by etching, by means of electron beam lithography, as shown in FIG. 10. In case where the undercoat resist layer was formed with a methacrylic polymer, such as PMMA, PBS was used to form the overcoat resist layer, followed by formation of the pattern 15'. In case where a methacrylate polymer was used to form the overcoat resist layer, the undercoat layer was exposed to deep ultraviolet rays, from which the rays having the wavelengths of less than 250 nm were removed, for 5 to 10 minutes. Since the methacrylate polymer was sensitive only to the light rays having wavelengths of less than 250 nm, the overcoat resist pattern 15' was not silylated, contrary to Examples 1 to 3, and the exposed surface regions 16' of the undercoat resist layer were silylated as shown in FIG. 11. In case where PBS was used to form the overcoat resist layer, since PBS was not sensitive to deep ultraviolet rays having wavelengths of more than 200 nm, the exposed surface regions the undercoat resist layer 16' was exposed directly by the light rays emitted from a Xe-Hg lamp or by the light rays from a low pressure mercury arc lamp through a filter (normally, 1 to 3 fused quartz plates each having a thickness of 10 to 20 mm being used for this purpose) for shielding the bright line ray having a wavelength of 184.9 nm, whereby the exposed surface regions of the undercoat resist layer were silylated. Then, the overcoat reverse pattern 15' and the regions of the undercoat resist layer covered thereby were removed by reactive ion etching while utilizing the silylated layer 16' formed on the surface of the undercoat resist layer as a mask, whereby the regions uncovered by the overcoat resist pattern were left on the substrate as a final desired pattern. As the result, a positive/negative reverse pattern 17' was formed, as shown in FIG. 12. The advantageous merits of this Example are substantially equivalent to those attainable by the preceding Example 1.

EXAMPLE 7

Although organic chlorosilanes were used in Examples 1 to 6 as the silylating agents, other halogenated silane compounds, such as trimethyliodosilane and trimethylfluorosilane, or alkoxysilanes were used in the liquid or vapor phase in which silylation was effected. The following procedures were the similar to those in the preceding Examples, wherein patterns were formed.

As will be seen from the foregoing, selected portions of the surface of a polymer layer is selectively silylated by the photochemical reaction with an organic silane monomer, according to the present invention. A variety of resist materials may be used in the method of the invention, since a pattern is initially formed with any resist material which does not contain Si and only the desired regions are silylated to be durable to the subsequent reactive ion etching. Then, the portions of the polymer layer which have not been silylated are removed by dry etching in an oxygen gas atmosphere or other reactive ion etching technology. Since the pattern is formed by any of ordinary resist materials, various lithographic techniques are applicable for the formation of the pattern, by the use of ultraviolet rays, deep ultraviolet rays, electron beam, X-ray or ion beams.

In summary, according to the present invention, various resist materials and various lithographic technologies may be employed to form a fine pattern of wide utility range on a bi-layer system resist through simplified steps. Accordingly, the present invention provides an improved method of forming a pattern to prepare various semiconductor elements, large scale integrated circuits and various other electron devices including submicro patterns.

What is claimed is:

1. A method of silylating a surface of an organic polymer membrane comprised of an organic polymer which is reactive with an organic silane compound under the irradiation of ultraviolet light and an organic polymer which is not reactive with an organic silane compound even under the irradiation of ultraviolet light comprising irradiating said organic polymer membrane with ultraviolet light while contacting said organic polymer membrane with said organic silane compound to silylate only the surface of said organic polymer which is reactive with an organic silane compound under the irradiation of ultraviolet light in said organic polymer membrane, said organic polymer membrane contacting said organic silane compound (i) by immersing said organic polymer membrane in a solution of said organic silane compound or (ii) by exposing said organic polymer membrane to a vapor of said organic silane compound.

2. The method as claimed in claim 1, wherein said organic silane compound is at least one selected from the group consisting of halogenated alkylsilanes, halogenated phenylsilanes, halogenated alkylphenylsilanes and alkoxysilanes.

3. The method as claimed in claim 1, wherein said organic polymer which is reactive with an organic silane compound under the irradiation of an ultraviolet ray is selected from the group consisting of cresol novolak resins, phenol novolak resins, vinyl phenol resins, polyvinyl alcohols and polyacrylates; said organic polymer which is to reactive with an organic silane compound even under the irradiation of an ultraviolet ray contains a base polymer selected from the group consisting of polyimides, polyethylene, polypropylene, and polyethylene terphthalates and said ultraviolet ray has a wavelength of from 180 to 300 nm.

4. The method as claiemd in claim 1, wherein said organic polymer which is reactive with an organic silane compound under the irradiation of an ultraviolet ray is selected from the group consisting of cresol, novolak resins, phenol novolak resins, vinyl phenol resins, polyvinyl alcohol and said organic polymer which is not reactive with an organic silane compound even under the irradiation of an ultraviolet ray contains a base polymer selected from the group consisting of polymethylmethacrylate and polybutenesulfone and wherein said ultraviolet ray has a wavelength of from 300 to 250 nm.

5. A method of silylating a surface of an organic polymer membrane comprised of an organic polymer which is reactive with an organic silane compound under the irradiation of ultraviolet light and an organic polymer which is not reactive with an organic silane compound even under the irradiation of ultraviolet light comprising irradiating said organic polymer membrane with ultraviolet light having a wavelength of from 190 to 250 nm while contacting aid organic polymer membrane with said organic silane compound to silylate only the surface of said organic polymer which is reactive with an organic silane compound under the irradiation of ultraviolet light in said organic polymer membrane, said organic polymer which is reactive with an organic silane compound under the irradiation with ultraviolet light is methylmethacrylate and said organic polymer which is not reactive with an organic silane compound even under irradiation with ultraviolet light contains a base polymer of polybutenesulfone.

6. A method of forming a pattern on a substrate comprising the steps of coating said substrate with a laminated organic polymer membrane including a layer of an organic polymer which is reactive with an organic silane compound under the irradiation of an ultraviolet ray and a layer of an organic polymer which is not reactive with an orgoanic silane compound even under the irradiation of an ultraviolet ray, forming a lithographically printed pattern by: exposing the laminated organic polymer membrane to an ultraviolet ray, an electron beam, x-ray or an ion beam; allowing said linated organic polymer membrane to contact with an organic silane compound under the irradiation of an ultraviolet ray having a wavelength of from 180 to 300 nm to introduce silyl groups in said organic polymer which is reactive with an organic silane compound under the irradiation of an ultraviolet ray thereby to form mask regions having durability to reactive ion etching, and subjecting said organic polymer membrane to reactive ion etching to form a pattern on said substrate.

7. The method of forming a patptern on a substrate as claimed in claim 6, wherein said laminated organic polymer membrane is formed by coating said substrate initially with a layer of said organic polymer which is not reactive with an organic silane compound even under the irradiation of an ultraviolet ray and then overcoating said organic polymer layer with a layer of said organic polymer which is reactive with an organic silane compound under the irradiation of an ultraviolet ray, and wherein a pattern is formed by said overcoated organic polymer layer lithographically printed by exposing the layer to either one of an ultraviolet ray, electron beam, x-ray or ion beam.

8. The method of forming a pattern on a substrate as claimed in claim 6, wherein said laminated organic polymer membrane is formed by coating said substrate initially with a layer of said organic polymer which is reactive with an organic silane compound under the irradiation of an ultraviolet ray and then overcoating said organic polymer layer with an overcoat layer of said organic polymer which is not reactive with an organic silane compound even under the irradiation of an ultraviolet ray, and wherein the poritons of said overcoat layer other than the regions forming the desired pattern are lithographically printed by exposing said overcoat layer to either one of an ultraviolet ray, electron beam, X-ray, or ion beam.

9. The method of forming a pattern on a substrate as claimed in claim 6, wherein said laminated organic polymer layers are allowed to contact with said silane compound either by immersing said membrane in a solution of said organic silane compound or by exposing said membrane to a vapor of said organic silane compound.

10. The method of forming a pattern on a substrate as claimed in claim 6, wherein said organic polymer which is not reactive with an organic silane compound even under the irradiation of an ultraviolet ray is selected from the group consisting of polyimides, polythene, polypropylene, polyethylene terphthalate, methylmethacrylate resins and polybutenesulfone resins.

11. The method of forming a pattern on a substrate as claimed in claim 6, wherein said organic polymer which is reactive with an organic silane compound under the irradiation of an ultraviolet ray is selected from the group consisting of cresol novolak resins, phenol novolak resins, vinyl phenol resins, polyvinyl alcohols and polyacrylates.

12. The method of forming a pattern on a substrate as claimed in claim 6, wherein said organic silane compound is selected from the group consisting of halogenated phenylsilanes, halogenated alkylphenylsilanes and alkoxysilanes.

13. The method of forming a pattern on a substrate as claimed in claim 6, wherein said reactive ion etching is oxygen or carbon dioxide reactive ion etching.

14. The method of forming a pattern on a substrate as claimed in claim 6, said method comprising the steps of coating a substrate initially with an undercoat resist of a polyimide layer, coating said undercoat resist with an overcoat layer of a resist forming material which reacts with an organic silane compound under the irradiation of an ultraviolet ray, said overcoat layer of resist forming material is selected from the group consisting of phenol novolak resins, cresol novolak resins, vinyl phenol resins and polybutenesulfone, forming a desired pattern on said overcoat resist by lithography, immersing said substrate in dimethylohloorosilane under the irradiation of an ultraviolet ray having a wavelength of from 180 to 300 nm to silylate selectively the portions of said overcoat resist thereby to render the regions forming said desired pattern to be durable to reactive ion etching, and subjecting said substrate to dry etching in an oxidative gas plasma to etch said undercoat resist while utilizing said regions forming said pattern and being rendered to be durable to reactive ion etching as a protective mask.

15. The method of forming a pattern on a substrate as claimed in claim 6, said method comprising the steps of coating a substrate initially with an undercoat resist made of a resist material which is reactive with an organic silane compound under the irradiation of an ultraviolet ray and selected form the group consisting of crecsol novolak resins, phenol novolak resins, vinyl phenol resins and polymethylmethacrylate, coating said undercoat resist with an overcoat resist made of a material selected from the group consisting of fluorobutylmethacrylate and polybutenesulfone, forming a mask pattern covering the portions other than the desired final pattern by lithography, immersing said substrate in dimethylchlorosilane to allow said undercoat resist to contact with dimethylochlorosilane under the irradiation of said ultraviolet ray to form an undercoat resist pattern combined with silyl group to have durability to reactive ion etching and subjecting said substrate to dry etching in an oxidative gas plasma to remove said overcoat resist forming said mask pattern and the portions of said undercoat resist covered by said mask pattern of said overcoat resist.

16. A method of silylating a surface of organic polymer membrane comprised of an organic polymer which is reactive with an organic silane compound under the irradiation of a ultraviolet ray and an organic polymer which is not reactive with an organic silane compound even under the irradiation of an ultraviolet ray and wherein said organic polymer which is reactive with an organic silane compound under the irradiation of an ultraviolet ray is selected form the group consisting of cresol novolak resins, phenol novolak resins, vinyl phenol resins, polyvinyl alcohols, and polyacrylates and said organic polymer which is not reactive with an organic silane compound even under the irradiation of an ultraviolet ray contains a base polymer selected from the group consisting of polyimides, polyethylenes, polypropylenes, and polyethylene terphthalates, said method comprising irradiating said organic polymer membrane an ultraviolet ray having a wavelength of from 180 to 300 nm while being allowed to contact with said organic silane compound either by immersing said membrane in a solution of said organic silane compound or by exposing said membrane to a vapor of said organic silane compound so as to silylate the surface of said organic polymer which is reactive with an organic silane compound under the irradiation of an ultraviolet ray, which is in said polymer membrane.

* * * * *